United States Patent
Rofougaran et al.

(10) Patent No.: US 8,274,147 B2
(45) Date of Patent: *Sep. 25, 2012

(54) METHOD AND SYSTEM FOR INTRA-PRINTED CIRCUIT BOARD COMMUNICATION VIA WAVEGUIDES

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 495 days.

This patent is subject to a terminal disclaimer.

(21) Appl. No.: 12/191,497

(22) Filed: Aug. 14, 2008

(65) Prior Publication Data

US 2009/0318105 A1 Dec. 24, 2009

Related U.S. Application Data

(60) Provisional application No. 61/073,934, filed on Jun. 19, 2008.

(51) Int. Cl.
*H01L 23/58* (2006.01)
(52) U.S. Cl. ................. 257/728; 257/E23.002; 333/108
(58) Field of Classification Search .................. 257/728, 257/E23.002; 333/105, 108
See application file for complete search history.

(56) References Cited

U.S. PATENT DOCUMENTS

| | | | |
|---|---|---|---|
| 5,768,109 A * | 6/1998 | Gulick et al. ................. | 361/794 |
| 5,990,757 A * | 11/1999 | Tonomura et al. ........... | 333/17.2 |
| 7,002,439 B2 * | 2/2006 | Rottenberg et al. ........... | 333/262 |
| 7,084,715 B2 | 8/2006 | Al-Taei et al. | |
| 7,138,884 B2 | 11/2006 | Cheung et al. | |
| 7,149,496 B2 | 12/2006 | Horiuchi et al. | |
| 7,289,008 B2 | 10/2007 | Kuroki et al. | |
| 7,348,842 B2 | 3/2008 | Ichitsubo et al. | |
| 7,402,897 B2 * | 7/2008 | Leedy ............................ | 257/678 |
| 7,504,710 B2 * | 3/2009 | Suzuki ........................... | 257/659 |
| 7,583,169 B1 * | 9/2009 | Scardelletti ................... | 333/262 |
| 2002/0021197 A1 * | 2/2002 | Elco ............................... | 333/248 |
| 2003/0198032 A1 * | 10/2003 | Collander et al. ............ | 361/760 |
| 2004/0222506 A1 | 11/2004 | Wei et al. | |
| 2005/0104684 A1 * | 5/2005 | Wojcik et al. ................. | 333/108 |
| 2007/0063342 A1 * | 3/2007 | Chen et al. .................... | 257/728 |
| 2009/0127674 A1 * | 5/2009 | Suzuki ........................... | 257/659 |
| 2009/0206473 A1 * | 8/2009 | Lopez et al. ................... | 257/728 |

* cited by examiner

*Primary Examiner* — Allan R Wilson
(74) *Attorney, Agent, or Firm* — Farjami & Farjami LLP

(57) ABSTRACT

Methods and systems for intra-printed circuit board communication via waveguides are disclosed and may include communicating one or more signals between or among a plurality of integrated circuits via one or more waveguides integrated on a printed circuit board. The integrated circuits may be bonded to the printed circuit board. The waveguides may be configured via switches integrated within each of the plurality of integrated circuits. The one or more signals may include microwave signals. The one or more waveguides may be configured for communicating microwave signals with a frequency of 60 GHz or greater. The communication of the one or more signals may be configured via a low frequency control signal, which may include a digital signal. The one or more waveguides may include metal and/or semiconductor layers deposited on and/or embedded within the printed circuit board.

18 Claims, 4 Drawing Sheets

METHOD AND SYSTEM FOR INTRA-PRINTED CIRCUIT BOARD COMMUNICATION VIA WAVEGUIDES

CROSS-REFERENCE TO RELATED APPLICATIONS/INCORPORATION BY REFERENCE

This application makes reference to and claims priority to U.S. Provisional Application Ser. No. 61/073,934 filed on Jun. 19, 2008, which is hereby incorporated herein by reference in its entirety.

This application makes also reference to:
U.S. patent application Ser. No. 12/191,553 filed on Aug. 14, 2008;
U.S. patent application Ser. No. 12/058,423 filed on Mar. 28, 2008; and
U.S. patent application Ser. No. 12/191,605 filed on Aug. 14, 2008.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for intra-printed circuit board communication via waveguides.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for intra-printed circuit board communication via waveguides, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for intra-printed circuit board communication via waveguides. Exemplary aspects of the invention may comprise communicating one or more signals between or among a plurality of integrated circuits via one or more waveguides integrated on a printed circuit board. The integrated circuits may be bonded to the printed circuit board. The waveguides may be configured via switches integrated within each of the plurality of integrated circuits. The signals communicated via the waveguides may comprise microwave signals. The one or more waveguides may be configured for communicating microwave signals with a frequency of 60 GHz or greater. The communication of the one or more signals may be configured via a low frequency control signal, which may comprise a digital signal. The one or more waveguides may comprise metal and/or semiconductor layers deposited on and/or embedded within the printed circuit board.

Figure 1:
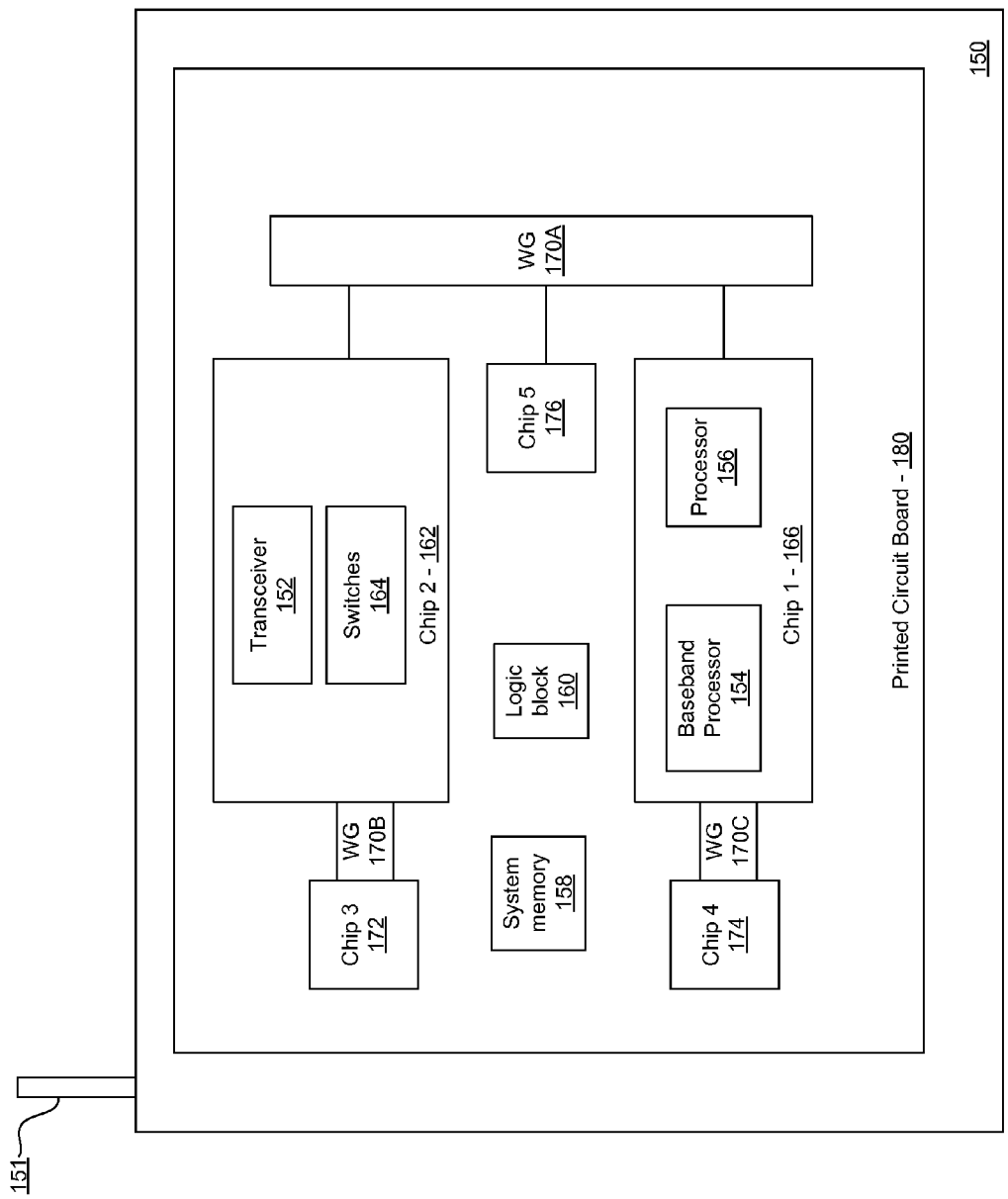
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, and a printed circuit board (PCB) 180. The PCB 180 may serve as a mechanical support and electrical interconnect structure for a system memory 158, a logic block 160, a chip 1 166, a chip 2 162, waveguides 170A, 170B, and 170C, a chip 3 172, a chip 4 174, and a chip 5 176. In an exemplary embodiment of the invention, the chip 1 166 may comprise a baseband processor 154 and a processor 156, and the chip 2 162 may comprise a transceiver 152 and a switch array 164. The chip 3 172, chip 4 174, and chip 5 176 may comprise circuitry for any other functions of the wireless system 150.

However, the invention may not be limited to the number of chips and waveguides shown in FIG. 1. Any number of components and/or arrangements of circuitry may be integrated on any particular chip bonded to the PCB 180, and any number of waveguides may be integrated within the PCB 180 to enable communication between chips as defined by space on the PCB 180 and the functional requirements of the wireless system 150. The antenna 151 may be used for reception and/or transmission of RF signals.

The switch array 164 may comprise an array of CMOS transistors, for example, which may enable the configuration of the waveguides 170A and 170B. The switch array 164 may enable and/or disable sections of the waveguides 170A and 170B such that the performance characteristics, such as frequency and/or insertion losses, for example, may be optimized for a desired communication standard communicated by the transceiver 152. The chip 1 166 may comprise a similar switch array in instances where it may be desired to configure the waveguide 170C.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering, coupling, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The PCB 180 may comprise multiple layers of insulating and conductive material for integrating multiple devices on a single board in the wireless system 150. In an embodiment of the invention, integrated circuits may be flip-chip bonded to the PCB 180. In this manner, devices integrated into the PCB 180 may be coupled to devices within an integrated circuit with low parasitic impedances. One or more waveguides, such as the waveguide 170A, 170B, and 170C may enable communication between the chips. By integrating waveguides on the PCB 180, inter-chip, as well as other device, communication may be enhanced through reduced stray impedances, and reduced interconnect dimensions.

The waveguides 170A, 170B, 170C may comprise suitable circuitry, logic and/or code that may enable the communication of electromagnetic signals between devices on and/or integrated within the PCB 180. The waveguides 170A, 170B, 170C may be configured to communicate at a specific frequency, 60 GHz or greater, for example, while still allowing low frequency control signals to propagate between devices. The control signals may allow setup, configuration and management of the microwave signal communication in the wireless system 150, for example.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. In an embodiment of the invention, the processor 156 may configure the waveguides 170A, 170B, 170C to communicate signals of a desired frequency, 60 GHz or higher, for example, between the chips and devices bonded to the PCB 180.

Additionally, low frequency, or out-of-band control signals, such as a system management bus (SMBus) signal, for example, may also be communicated via the waveguides 170A, 170B, 170C. The low-frequency wire interfaces may be used to improve Bluetooth-WLAN coexistence and/or antenna sharing in some instances. The 3-wire interface, for example, may be used for Bluetooth-WLAN coexistence, in accordance with the IEEE 802.15.2 Recommended Practice. The 2-wire and 3-wire interface techniques may not permit the transmission of sophisticated data management data to a centralized management device and may be limited to blocking the resource access of one device while a transmission, for example, may be taking place on the other device.

Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

Figure 2:
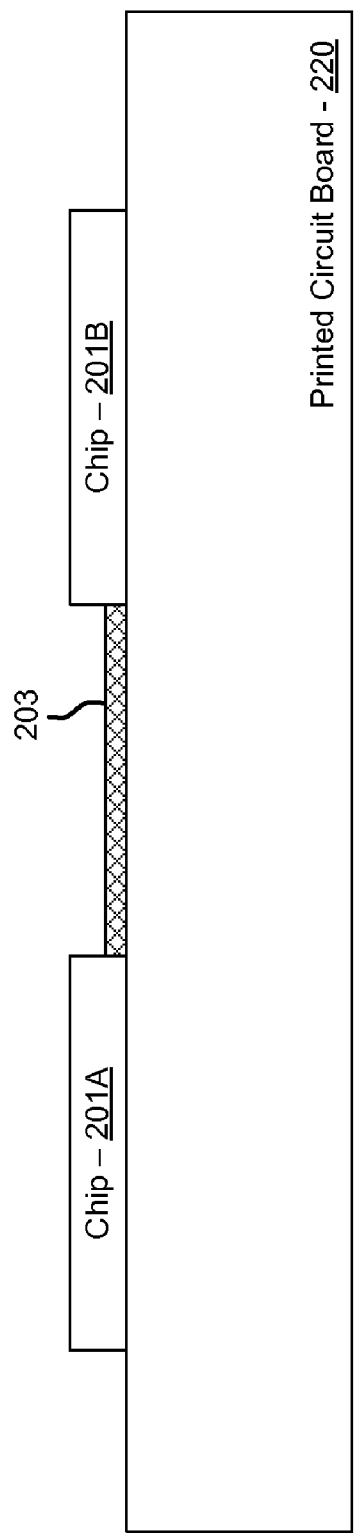
FIG. 2 is a block diagram illustrating a cross-sectional view of a printed circuit board with waveguides, in accordance with an embodiment of the invention.

FIG. 2 is a block diagram illustrating a cross-sectional view of a printed circuit board with waveguides, in accordance with an embodiment of the invention. Referring to FIG. 2, there is shown chips 201A and 201B, a waveguide 203, and the PCB 220.

The chips 201A and 201B, or integrated circuits, may comprise one or more components and/or systems within the wireless system 150. The chips 201A and 201B may be bump-bonded or flip-chip bonded to the multi-layer package 213 utilizing the solder balls (not shown). In addition, the thermal conductance out of the chip 201 may be greatly improved utilizing solder balls and thermal epoxy (not shown). The thermal epoxy may be electrically insulating but thermally conductive to allow for thermal energy to be conducted out of the chips 201A and 201B to the much larger thermal mass of the PCB 220. In another embodiment of the invention, the chips 201A and 201B may be soldered to the PCB 220, such as by surface mount or through-hole techniques, for example.

The waveguide 203 may comprise metal layers deposited on or embedded within the PCB 220 such that a signal may be communicated in the space between the metal layers. The waveguide 203 may comprise a coplanar waveguide structure. In another embodiment of the invention, one or more of the metal layers may comprise ferromagnetic and/or ferrimagnetic layers utilized to define devices such as transformers, inductors, baluns, isolators, circulators, and gyrators.

In operation, the chips 201A and 201B may comprise an RF front end, such as the RF transceiver 152, described with respect to FIG. 1, and may be utilized to transmit and receive RF signals. The chips 201A and 201B may be electrically coupled to the PCB 220 and may communicate via waveguides integrated on the PCB 220. In another embodiment of the invention, the waveguide 203 may be integrated within the PCB 220. In an embodiment of the invention, a processor, such as the processer 156 described with respect to FIG. 1, may configure the waveguide 203 such that the chips 201A and 201B may communicate via the waveguide 203, providing a high frequency signal path, 60 GHz or higher, for example, as well as providing a path for low frequency control signals for the chips 201A and 201B. The low frequency control signals may comprise 3-wire signal signals comprising clock and data streams, for example.

The waveguide 203 may be configured by adjusting the length of the metal layers comprising the structure, and may be configurable via switches in the chips 201A and/or 201B and/or MEMS switches integrated in the PCB 220. In this manner, the communication parameters of waveguides integrated into the PCB 220 may be configured for a plurality of applications.

By integrating waveguides in the PCB 220, stray impedances may be greatly reduced compared to conventional wire traces between devices on printed circuit boards as in conventional systems. In this manner, volume requirements may be reduced and performance may be improved due to lower losses and accurate control of impedances via switches in the chips 201A and 201B or on the PCB 220, for example.

Figure 3:
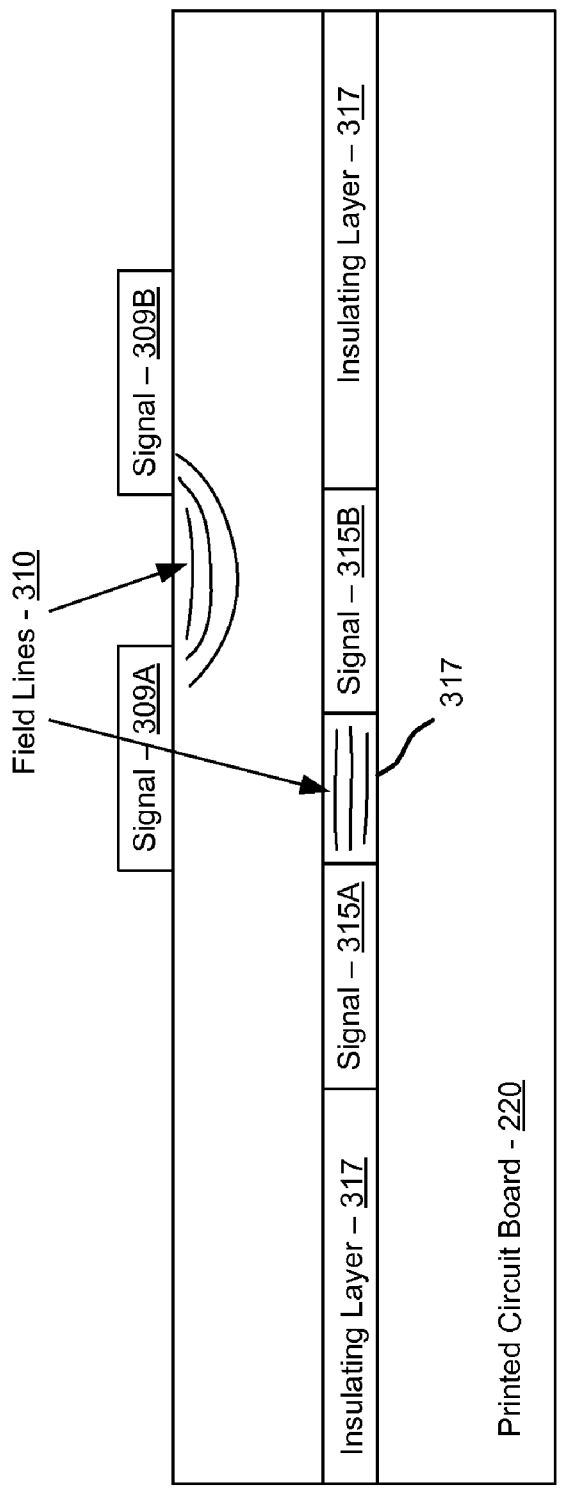
FIG. 3 is a block diagram illustrating a cross-sectional view of coplanar waveguides, in accordance with an embodiment of the invention.

FIG. 3 is a block diagram illustrating a cross-sectional view of coplanar waveguides, in accordance with an embodiment of the invention. Referring to FIG. 3, there is shown coplanar waveguides comprising the metal layers 309A, 309B, and also the metal layers 315A and 315B and the insulating layer 317, and the field lines 310. The metal layers 309A/309B and 315A/315B may comprise signals lines for the waveguides, and the electric fields between the metal lines, as indicated by the field lines 310, may be configured by the dielectric constant of the material, or air, between the layers as well as the spacing between them. In the case of the metal layers 315A and 315B, the dielectric constant of the insulating layer 317 may configure the electric field. In another embodiment of the invention, the metal layers 309A/309B and 315A/315B may comprise poly-silicon or other conductive material. The insulating layer 317 may comprise a highly resistive material that may provide electrical isolation between the metal layers 315A and 315B. The dielectric constant of the insulating layer 317 may configure the electrical field generated by the voltages applied across the metal layers 309A/309B and 315A/315B.

In operation, one or more signals may be applied across the metal layers 309A/309B, and/or the metal layers 315A and 315B. The waveguides defined by the metal layers 309A/309B and 315A/315B may enable communication between integrated circuits, such as the chips 201A and 201B coupled to the PCB 220. In this manner, a high frequency signal path may be utilized while reducing system cost and size by integrating waveguides in the PCB 220. By utilizing waveguides as opposed to simple wire traces on the PCB 220, signal frequencies may be increased, 60 GHz and greater, for example, with reduced losses due to the reduced impedances of the waveguides at these higher frequencies.

Figure 4:
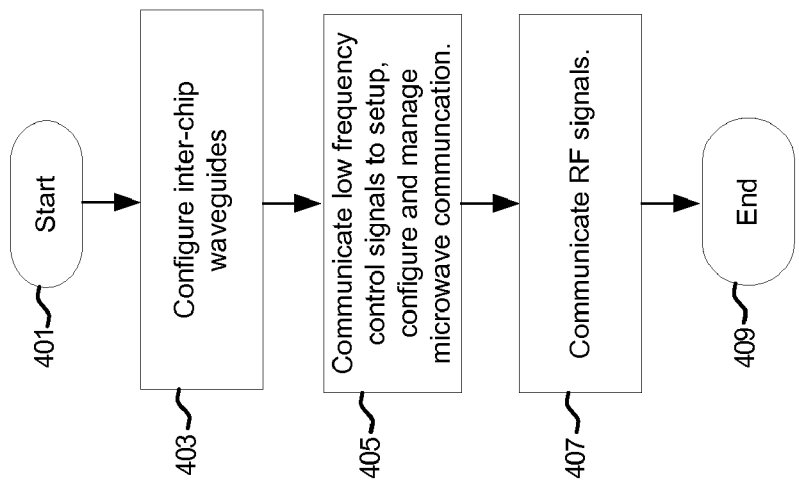
FIG. 4. is a block diagram illustrating exemplary intra-printed circuit board communication via waveguides, in accordance with an embodiment of the invention.

FIG. 4. is a block diagram illustrating exemplary intra-printed circuit board communication via waveguides, in accordance with an embodiment of the invention. In step 403, after start step 401, one or more waveguides may be configured for desired signal transmission frequencies. In step 405, low frequency control signals may be communicated to setup, configure and/or manage microwave communication via the waveguide 203, followed by step 407, where a microwave signal may be communicated via the waveguide 203 in the PCB 220, followed end step 409.

In an embodiment of the invention, a method and system are disclosed for intra-printed circuit board communication via waveguides. Exemplary aspects of the invention may comprise communicating one or more signals between or among a plurality of integrated circuits 166, 168, 172, 174 and 176 via one or more waveguides 170A, 170B, 170C, and 170D integrated on a printed circuit board 180. The integrated circuits 166, 168, 172, 174 and 176 may be bonded to the printed circuit board 180. The waveguides 170A, 170B, and 170C may be configured via switches integrated within each of the plurality of integrated circuits 166, 168, 172, 174 and 176. The signals communicated via the waveguides 170A, 170B, and 170C may comprise microwave signals. The one or more waveguides may be configured for communicating microwave signals with a frequency of 60 GHz or greater. The communication of the one or more signals may be configured via a low frequency control signal, which may comprise a digital signal. The one or more waveguides 170A, 170B, 170C, and 170D may comprise metal and/or semiconductor layers deposited on and/or embedded within the printed circuit board 220.

Certain embodiments of the invention may comprise a machine-readable storage having stored thereon, a computer program having at least one code section for intra-printed circuit board communication via waveguides, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
    communicating one or more signals between or among a plurality of integrated circuits via one or more waveguides integrated in and/or on a printed circuit board, wherein said integrated circuits are bonded to said printed circuit board; and
    configuring an electrical length of said one or more waveguides via switches integrated within each of said plurality of integrated circuits.

2. The method according to claim 1, wherein said one or more signals comprises a microwave signal.

3. The method according to claim 2, comprising configuring said electrical length of said one or more waveguides for communicating said microwave signals with a frequency of 60 GHz or greater.

4. The method according to claim 1, comprising configuring said electrical length of said one or more waveguides via a low frequency control signal.

5. The method according to claim 4, wherein said low frequency control signal comprises a digital signal.

6. The method according to claim 1, wherein said one or more waveguides comprise metal layers deposited on said printed circuit board.

7. The method according to claim 1, wherein said one or more waveguides comprise metal layers embedded within said printed circuit board.

8. The method according to claim 1, wherein said one or more waveguides comprise semiconductor layers deposited on said printed circuit board.

9. The method according to claim 1, wherein said one or more waveguides comprise semiconductor layers embedded within said printed circuit board.

10. A system for wireless communication, the system comprising:
    one or more circuits in each of a plurality of integrated circuits, wherein each of said plurality of integrated circuits is bonded to a printed circuit board, and wherein said one or more circuits enables:
        communication of one or more signals between or among each of said plurality of integrated circuits via one or more waveguides integrated in and/or on said printed circuit board; and
        configuration of an electrical length of said one or more waveguides via switches integrated within each of said plurality of integrated circuits.

11. The system according to claim 10, wherein said one or more signals comprises a microwave signal.

12. The system according to claim 11, wherein said one or more circuits enables configuring said electrical length of said one or more waveguides for communicating said microwave signals with a frequency of 60 GHz or greater.

13. The system according to claim 10, wherein said one or more circuits enables configuration of said electrical length of said one or more waveguides via a low frequency control signal.

14. The system according to claim 13, wherein said low frequency control signal comprises a digital signal.

15. The system according to claim 10, wherein said one or more waveguides comprise metal layers deposited on said printed circuit board.

16. The system according to claim 10, wherein said one or more waveguides comprise metal layers embedded within said printed circuit board.

17. The system according to claim 10, wherein said one or more waveguides comprise semiconductor layers deposited on said printed circuit board.

18. The system according to claim 10, wherein said one or more waveguides comprise semiconductor layers embedded within said printed circuit board.

* * * * *